(12) United States Patent
Kwon et al.

(10) Patent No.: US 9,904,596 B2
(45) Date of Patent: *Feb. 27, 2018

(54) SERIAL BUS EVENT NOTIFICATION IN A MEMORY DEVICE

(71) Applicant: Integrated Silicon Solution, Inc., Milpitas, CA (US)

(72) Inventors: Kookhwan Kwon, San Ramon, CA (US); Jong Hun Park, San Ramon, CA (US); Lyn R. Zastrow, Prosper, TX (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/586,115

(22) Filed: May 3, 2017

(65) Prior Publication Data

US 2017/0308433 A1     Oct. 26, 2017

Related U.S. Application Data

(63) Continuation-in-part of application No. 15/354,773, filed on Nov. 17, 2016, which is a continuation-in-part of application No. 14/279,113, filed on May 15, 2014, now Pat. No. 9,529,667.

(51) Int. Cl.
*H03M 13/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ............. G06F 11/1068; G06F 11/1048; G06F 11/1076; G11C 29/52
See application file for complete search history.

(56) References Cited

U.S. PATENT DOCUMENTS

| | | | |
|---|---|---|---|
| 7,373,583 B2 * | 5/2008 | Hummler | G11C 29/02 714/763 |
| 8,271,701 B1 | 9/2012 | Nguyen | |
| 9,529,667 B2 | 12/2016 | Zastrow | |
| 2008/0133985 A1 | 6/2008 | Riho et al. | |
| 2011/0004805 A1 | 1/2011 | Seo | |
| 2011/0138252 A1 | 6/2011 | Pawlowski et al. | |
| 2013/0117641 A1 | 5/2013 | Bains et al. | |
| 2013/0339821 A1 | 12/2013 | Cordero et al. | |

(Continued)

OTHER PUBLICATIONS

U.S. Appl. No. 15/354,773, filed Nov. 17, 2016.

*Primary Examiner* — Guy Lamarre
(74) *Attorney, Agent, or Firm* — Innovation Counsel LLP

(57) ABSTRACT

A memory device incorporates a serial data bus coupled to a serial bus control circuit to provide access to error correction event notification information and error correction function configuration information. In some embodiments, the serial bus control circuit is in communication with a set of registers storing error correction event information and error correction function configuration information. The serial data bus enables access to the error correction control functions and to the error correction event notification information without interfering with and independent of the normal memory operation of the memory device.

15 Claims, 8 Drawing Sheets

(56) References Cited

U.S. PATENT DOCUMENTS

2014/0016419 A1 1/2014 Hold
2014/0126302 A1 5/2014 Yoon et al.
2017/0132075 A1* 5/2017 Zastrow .............. G06F 11/1048

* cited by examiner

Mode Register Assignment

| MR# | MA<7:0> | Function | Access | OP7 | OP6 | OP5 | OP4 | OP3 | OP2 | OP1 | OP0 |
|---|---|---|---|---|---|---|---|---|---|---|---|
| 0 | 00$_H$ | Device Info. | R | ECC Event | | | | | | DI | DAI |
| 1 | 01$_H$ | Device Feature1 | W | | nWR (for AP) | | WC | BT | | | BL |
| 2 | 02$_H$ | Device Feature2 | W | | | | | | RL & WL | | |
| ... | | | | | | | | | | | |
| 11 | 0B$_H$ | Clear ECC Event | W | ECC On/Off | | | | | | PIN | CLR ECC |
| 12 | 0C$_H$ | Memory Bank of ECC Event | R | Memory Bank ID | | | | | | | |
| 13 | 0D$_H$ | Address (MSB bits) of ECC Event | R | High Address Word (ADDR-H) | | | | | | | |
| 14 | 0E$_H$ | Address (LSB bits) of ECC Event | R | Low Address Word (ADDR-L) | | | | | | | |
| 15 | 0F$_H$ | Reserved | | | | | | | | | |

FIG. 3

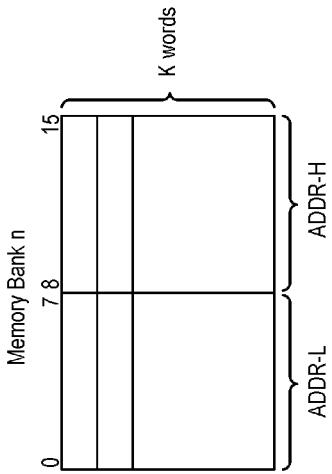

FIG. 2

Mode Register Assignment

| MR# | MA<7:0> | Function | Access | OP7 | OP6 | OP5 | OP4 | OP3 | OP2 | OP1 | OP0 |
|---|---|---|---|---|---|---|---|---|---|---|---|
| 0 | 00$_H$ | ECC Event | R | ECC On/Off | | | | | | | ECC Event |
| 1 | 01$_H$ | Clear ECC Event | W | | | | CLR ECC | | | | |
| 2 | 02$_H$ | ECC Pin | W | PIN | | | | | | | |
| 3 | 0B$_H$ | Reserved | | | | | | | | | |
| 4 | 0C$_H$ | Memory Bank of ECC Event | R | Memory Bank ID |||||||| 
| 5 | 0D$_H$ | Address (MSB bits) of ECC Event | R | High Address Word (ADDR-H) ||||||||
| 6 | 0E$_H$ | Address (LSB bits) of ECC Event | R | Low Address Word (ADDR-L) ||||||||
| 7 | 0F$_H$ | Reserved | | | | | | | | | |

FIG. 5

ECC Registers Assignment — 430

| Register# | Function | Access | OP7 | OP6 | OP5 | OP4 | OP3 | OP2 | OP1 | OP0 |
|---|---|---|---|---|---|---|---|---|---|---|
| 0 | ECC Counters and Functions | R | Multi-Bit Error Counter | | | One-Bit Error Counter | | | ECC Type | ECC Event |
| 1 | Column Addr/Bank of ECC Event | R | Column Addr[4:0] | | | | | Bank Addr[2:0] | | |
| 2 | Column Addr of ECC Event | R | Column Addr[12:5] | | | | | | | |
| 3 | Row Addr of ECC Event | R | Row Addr[7:0] | | | | | | | |
| 4 | Row Addr of ECC Event | R | Row Addr[15:8] | | | | | | | |
| 5 | ECC Control Functions | W/R | Reserved | | | CLR ECC | ERR Type | | ERR ON | ECC ON |

FIG. 7

I²C Slave Address Frame

| MSB | | | | | | | LSB |
|---|---|---|---|---|---|---|---|
| 1st | 2nd | 3rd | 4th | 5th | 6th | 7th | 8th |
| 0 | 0 | 1 | 1 | Reserved | AD[1] | AD[0] | R/W# |
| Device Type or Slave ID | | | | Device Select Address | | | Write or Read |

I²C Register Address Frame

| MSB | | | | | | | LSB |
|---|---|---|---|---|---|---|---|
| 1st | 2nd | 3rd | 4th | 5th | 6th | 7th | 8th |
| Reserved | Reserved | Reserved | Reserved | Reserved | A[2] | A[1] | A[0] |
| | | | | | Valid Address | | |

SERIAL BUS EVENT NOTIFICATION IN A MEMORY DEVICE

CROSS REFERENCE TO OTHER APPLICATIONS

This application is a continuation-in-part of U.S. patent application Ser. No. 15/354,773, entitled SERIAL BUS DRAM ERROR CORRECTION EVENT NOTIFICATION, filed Nov. 17, 2016, which is a continuation-in-part of U.S. patent application Ser. No. 14/279,113, entitled DRAM ERROR CORRECTION EVENT NOTIFICATION, filed May 15, 2014, now U.S. Pat. No. 9,529,667, issued Dec. 27, 2016, which applications are incorporated herein by reference for all purposes.

BACKGROUND OF THE INVENTION

Modern day semiconductor memories have been produced with very high storage capacities (hundreds of millions of bits) with scaling down of transistors and the power source voltage. However, an incremental increase in storage capacity with low power source voltage tends to reduce the reliability of these memory devices. For example, the scaling down of transistor has reduced the capacitance in each memory cell, often resulting in random one-bit error due to cosmic radiation or alpha radiation or other random event. There are also coupling effects internal to the silicon, silicon aging effects, and DRAM bits changing state before a refresh due to increased temperatures. These random one-bit errors occur frequently enough that such errors can no longer be ignored as these devices are employed into systems where a bit-error could have a catastrophic consequence. The increase in the number of cells in memory devices tends to reduce the mean time to failure (MTTF) of the entire memory device. As a result, the level of reliability required for the memory device become increasingly stringent. In some applications, semiconductor memory devices have been implemented with error correction to improve the reliability of the memory devices.

Error correction code (ECC) is a technique that can be used to reduce or recover bit errors in memory devices. A well know error correction code is the Hamming code, which appends a series of check bits to a data word as the data word is stored in the memory device. Upon a read operation, the retrieved check bits are compared to recalculated check bits to detect and correct bit errors in the read out data. By adding more check bits and appropriately overlapping the subsets of data bits represented by the check bits, these error correcting codes may provide for multiple error corrections and detection. ECC error correction operation is performed transparent to the user or to the system in which the memory device is incorporated. The read out data from the memory device bears no distinction between original data or corrected data.

BRIEF DESCRIPTION OF THE DRAWINGS

Various embodiments of the invention are disclosed in the following detailed description and the accompanying drawings.

FIG. 2 illustrates a memory bank n of the memory device 60 organized as K words of 16-bit memory data in one example.

FIG. 3 illustrates mode register assignments for a set of mode registers which can be incorporated into the memory device of FIG. 1 to implement the error correction event notification method in embodiments of the present invention.

FIG. 5 illustrates mode register assignments for a set of mode registers which can be incorporated into the memory device of FIG. 1 to implement the error correction event notification method using a serial bus in embodiments of the present invention.

FIG. 7 illustrates register assignments for the ECC registers which can be incorporated into the memory device of FIG. 6 to implement the error correction event notification method in embodiments of the present invention.

DETAILED DESCRIPTION

Figure 1:
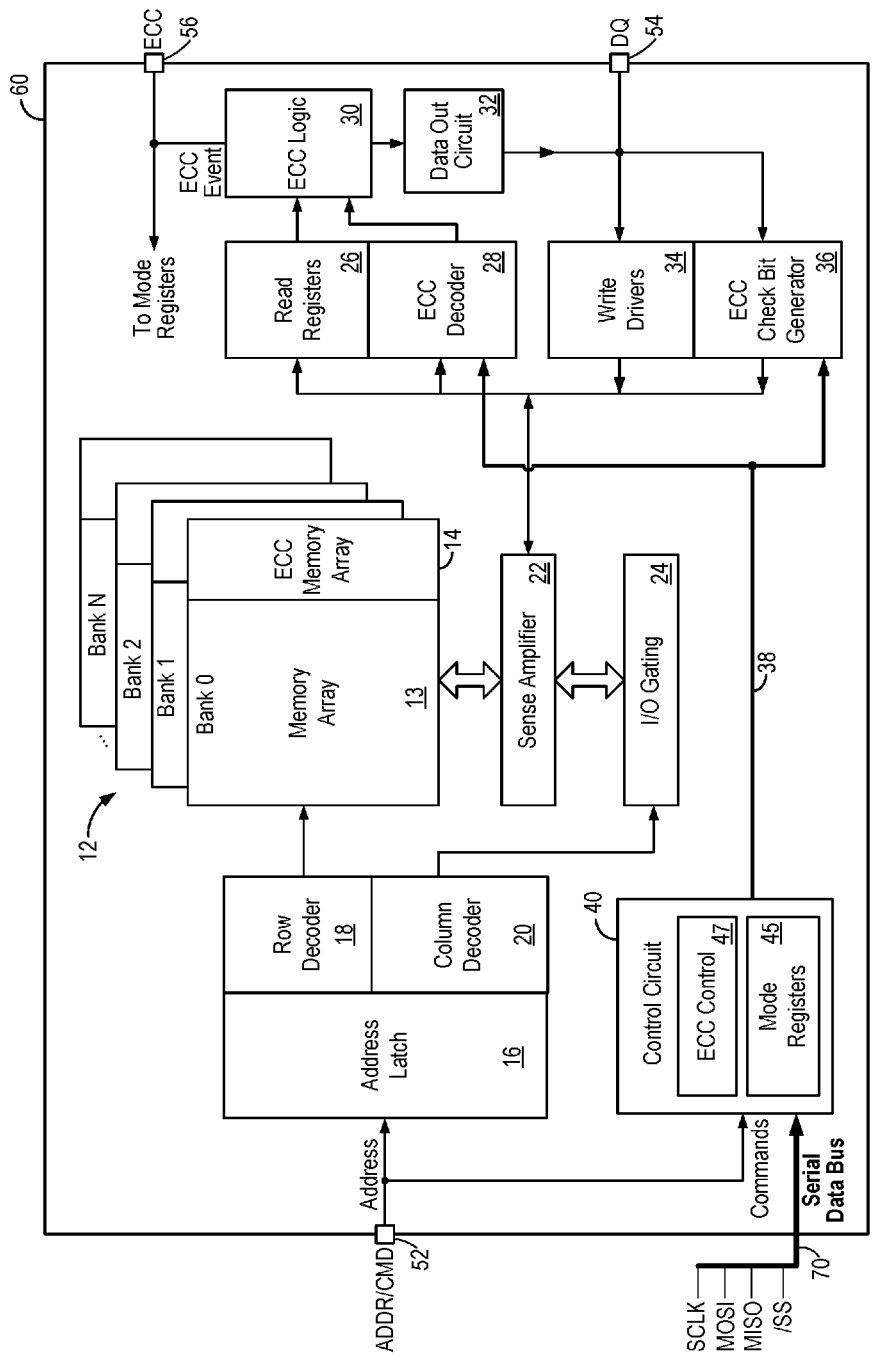
FIG. 1 is a block diagram of a memory device implementing an error correction event notification method using a serial data bus interface in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a memory device implementing error correction is configured to record the memory location of an error correction event and to provide a notification thereof. In this manner, a system or a user using the memory device of the present invention may monitor the error correction event notification to obtain information on the occurrence of error correction events and/or the memory locations of the bit errors. Meanwhile, data read out from the memory device continues with the error checking and correction operation being performed transparent to the data read out process. The error correction event notification method of the present invention can be implemented in a memory device to give insight into the health of the memory device and enabling preventive repair or replacement of the memory device or system in which it is used when needed.

In some embodiments, a memory device incorporates a serial data bus coupled to the control circuit of the memory device to provide direct access to the error correction control circuit and to the error correction event notification information stored in mode registers of the control circuit. The error correction event notification information includes error correction event notification data and functions. The serial data bus enables access to the error correction control functions and to the error correction event notification information without requiring modifications to the memory controller used to control and communicate with the memory device. Furthermore, the serial data bus enables access to the error correction control functions and to the error correction event notification information without interfering with and independent of the normal memory operation of the memory device. In some embodiments, the serial data bus is an I²C serial data bus.

In embodiments of the present invention, a memory device implements error correction code (ECC) as the error correction technique to recover from bit errors in the memory array. One example of an error correction code is the Hamming code, which appends a series of check bits to a data word as the data word is stored in the memory device. Upon a read operation, the retrieved check bits are compared to recalculated check bits to detect and correct bit errors in the read out data. Other error correction methods and techniques may be applied in the memory device in other embodiments. The use of the ECC error correction technique in the present description is illustrative only. Accordingly, in some embodiments, the error correction event notification method of the present invention is implemented in a memory device using ECC for error detection and correction where the memory array stores memory data and associated check bits for performing ECC operation. In the present description, an error correction event, also referred to as an "ECC event," occurs when an error is detected in the read out data from the memory array and the stored check bits are used to recover the correct read out data.

In some embodiments, the error correction event notification method is implemented in a monolithic memory device. A monolithic memory device refers to a standalone memory integrated circuit and may also be referred to as a memory integrated circuit or a memory chip. A monolithic memory device provides primarily data storage functions and is to be distinguished from an integrated circuit with an embedded memory formed thereon where the integrated circuit has primary functions other than for storing data. For example, a microprocessor integrated circuit with embedded memory is not a monolithic memory device in the present description. In the present description, the memory device may be a volatile memory device, such as a random access memory (SRAM) device, including static random access memory (SRAM) devices, dynamic random access memory (DRAM) devices, synchronous DRAM (SDRAM) devices, and double data rate random access memory (DDR RAM) devices. Furthermore, in the present description, the memory device may further be a non-volatile memory device, such as FLASH memory devices, or other types of persistent storage devices.

In a conventional memory device implementing ECC, the ECC operation is transparent to the system or the user. The system or the user of the memory device does not know which, if any, of the read out data has been error corrected. Transparent error correction operation in the memory read out process is intentional and is viewed as a benefit of the error correction technique in that errors in the memory read out data are automatically corrected without involvement or intervention from the external system or a user.

Increasingly, memory devices are being incorporated into safety systems or into systems where safety is a primary concern. For example, DRAM devices are being incorporated into automobile safety equipment or systems, such as machine vision camera systems used for lane departure warning and blind spot detection, or automotive radar systems that are used for adaptive cruise control and collision avoidance systems. As memory devices with ECC are applied in these safety-critical applications, it may be necessary to know actually when an ECC event has occurred and/or when the read out data has been ECC corrected. For example, international standards, such as the ISO26262 standard, may require a system to have knowledge of an error correction event occurring in the system during the course of operation. The system may also need to know the location in the memory array where the error is occurring in order to determine if an error persists at the same location. In embodiments of the present invention, a memory device with ECC implements the error correction event notification method of the present invention to record the occurrence of an error correction event in the memory device. Additional information, such as the location of the error in the memory device, may also be recorded and stored in the memory device. The system or a user may monitor the ECC event notification to keep track of occurrences of ECC events. The system or user may further obtain information concerning the memory locations at which each ECC event occurs to determine if compensating action needs to be taken.

In embodiments of the present invention, the error correction event notification method is implemented in a memory device using the reserved or unused mode register cells in the mode registers or control registers of the memory device for error correction event notification. In this manner, error correction event notification can be provided using existing circuit elements in the memory device, without requiring modification of or addition to the memory device circuitry. In one embodiment, unused or reserved mode register cells in the mode registers of the memory device are used to implement error correction event notification and also to store error correction event data, such as the memory bank ID and the memory address location where the error correction event has occurred. In alternate embodiments of the present invention, the error correction event notification method is implemented in a memory device using special purpose registers that are provided in the memory device apart from the mode registers. The special purpose registers may be provided to implement error correction event notification and also to store error correction event data, such as the memory bank ID and the memory address location where the error correction event has occurred. In the present description, registers or register cells, whether the reserved mode register cells or the special purpose registers, that are used for error correction event notification are referred to as "ECC event registers." An external system, such as a memory controller, coupled to control and communicate with the memory device, may access the designated ECC event registers, such as the "ECC event" mode register cell, to obtain the error correction event notification information.

ECC Event Notification Using a Serial Data Bus

Conventional memory controllers are often designed to access mode registers that are assigned for control operations and functions under the industry standard specification. The conventional memory controllers are typically not provided with means to access the unused or reserved mode registers or mode register cells as these mode registers or mode register cells are not used under the industry standard specification. Therefore, the conventional memory controllers may have to be modified in order to enable access to these unused or reserved mode register cells or the special purpose register cells to obtain the error correction event notification information. In some cases, modifications to memory controllers are not feasible or practical.

In embodiments of the present invention, a memory device, implementing an error correction event notification method described herein, incorporates a serial data bus coupled to the control circuit of the memory device to provide direct access to the error correction event notification information generated by the error correction event notification method and stored in the ECC event registers, such as the mode registers of the control circuit. Furthermore, the memory device uses the serial data bus to control the ECC functions, such as to turn the ECC function on or off in the memory device. The ECC functions may be controlled by accessing an ECC control circuit in the control circuit of the memory device through the serial data bus. The serial data bus is provided as an external interface to the memory device to enable an external system to communicate with the control circuit on the serial data bus to control or access the ECC functions of the memory device through the use of a serial data interface protocol. In this manner, the serial data bus enables an external system, such as microprocessor, to directly access and control the error correction event notification data and functions that are stored in the ECC event registers, without requiring any modification to the memory controller itself. For example, an external system, or a memory controller, may use a serial data interface client to communicate with the memory device on the serial data bus to access and control the error correction event notification information.

In some embodiments, the ECC control circuit and the associated ECC functions may be accessed by both the serial data bus and the parallel interface bus for the address and command signals. In particular, a memory device includes a parallel interface bus coupled to the control circuit to provide the address and command signals. This standard parallel interface bus can be used in addition to the serial data bus of the present invention to access the ECC control circuit and functions. In this manner, flexibility in access to the ECC control circuit is ensured.

In the present description, error correction event notification information refers to both the error correction event notification data, such as the ECC event indicator, the memory bank ID and the memory location address, and the error correction event notification control functions, such as the ECC Pin assignment and clearing or resetting of the values of the ECC event registers.

In some embodiments, the error correction event notification information are stored in unused or reserved mode registers of the control circuit of the memory device where the other mode registers of the control circuit are used to store control data for the control operation of the memory device, including control data for configuring operational functions and features of the memory device. In other embodiments, the error correction event notification information is stored in special purpose registers that are specifically designated for the error correction event notification and information.

In embodiments of the present invention, the memory device is provided with the serial data bus which is used to configure the error correction event notification function, such as to set the ECC Pin, and also to retrieve the error correction event notification data, such as the address location of the ECC error. In some embodiments, the serial data bus is a synchronous serial communication interface formed as a multi-wire serial bus. In one example, the serial data bus may include a serial clock signal, a serial data input signal, and a serial data output signal. In other examples, the serial data bus may further include an enable signal to enable the serial data bus.

In some embodiments, the serial data bus incorporated in the memory device is a Serial Peripheral Interface (SPI) bus. The Serial Peripheral Interface (SPI) is a synchronous serial communication interface that provides full-duplex synchronous serial communication between master and slave devices. The SPI bus is a four-wire serial bus including four logic signals with signaling convention specified by the SPI specification. In particular, the logic signals of the SPI bus includes: a serial clock (SCLK), a Master Output/Slave Input (or Serial Data Input SDI), a Master Input/Slave Output (or Serial Data Output SDO), and a Slave Select (or Enable EN).

In other embodiments, the serial data bus incorporated in the memory device is an PC (Inter-Integrated Circuit) bus. The I$^2$C is a multi-master, multi-slave, single-ended, serial computer bus. The I$^2$C is typically used for attaching lower-speed peripheral integrated circuits to processors and microcontrollers in short-distance, intra-board communication. The I$^2$C bus is sometimes referred to as I2C or IIC bus. The I$^2$C bus includes two wires called SCL and SDA. The SCL wire is the clock line used to synchronize data transfers over the I$^2$C bus. The SDA wire is the data line.

In embodiments of the present invention, the serial data bus is coupled to the control circuit of the memory device to provide direct access to the error correction event notification information. It is instructive to note that there are conventional memory devices with serial data interfaces used for memory data input and output or address/command input and output. In these conventional memory devices, the serial data bus is used for memory data or for the address and command used to access memory data. In embodiments of the present invention, a serial data bus is added to a memory device and configured for use in control functions only. The use of a serial data bus for control functions of a memory device has not been previously described.

In some embodiments, a memory device, such as a DRAM, includes a parallel data bus for memory data and address/command and a serial data bus for error correction event notification information. FIG. 1 is a block diagram of a memory device implementing an error correction event notification method using a serial data bus interface in embodiments of the present invention. Referring to FIG. 1, a memory device 60 includes a memory array 12 for storing memory data. The memory device 60 includes an address/command input terminal 52 to receive an M-bit input address Addr to access a memory location in the memory array 12. The memory device 60 also receives commands on the address/command input terminal 52. The memory device 60 further includes a data terminal 54 being a P-bit input/output data terminal to receive input memory data and to provide output memory data (or read out data). Thus, the P-bit memory data DQ may be write data or read data depending on the operation mode of the memory device. In the present embodiment, the address/command input terminal 52 and the data terminal 54 are both configured as parallel data buses. The M-bit input address Addr or commands are received on an M-bit parallel data bus as the address/command input terminal 52. Meanwhile, the P-bit memory read data or the P-bit memory write data are received or provided on a P-bit parallel data bus as the data terminal 54.

The memory device 60 in FIG. 1 is an example representation of a random access memory device, such as a DRAM device. The configuration of memory device 60 in FIG. 1 is illustrative only and is not intended to be limiting. The memory device 60 may include other elements or components not shown in FIG. 1 for simplicity reasons. Furthermore, the memory device 60 is a monolithic memory integrated circuit, or a standalone memory chip. The address/command input terminal 52 and the data terminal 54 are formed as multiple input or input-output pins on the integrated circuit. The memory integrated circuit may include other input and output terminals not shown in FIG. 1 for simplicity reasons. For example, the memory integrated circuit may include input-output pins for the power and ground connections and for control signals.

In the present embodiment, the memory device 60 implements ECC as the error correction technique to recover form bit errors in the memory array. In some embodiments of the present invention, the memory device 60 is a low power double data rate synchronous DRAM, or LPDDR2 SDRAM. The LPDDR2 SDRAM implements the error correction event notification method described above to enable the DRAM device to provide notification of an occurrence of an error correction event during data read out. In this manner, the LPDDR2 DRAM device can be implemented in systems requiring compliance with intentional standards, such as the ISO26262 standard, which require systems to be aware of the occurrence of an error correction event in a memory device incorporated therein.

Referring still to FIG. 1, the memory device 60 includes an address latch 16 to latch an input address Addr. The latched address is divided into a row address which is coupled to a row decoder 18 and a column address which is coupled to the column decoder 20. The row decoder decodes the row address and provides the decoded row address to the memory array 12 to activate an associated word line in the memory array. The column decoder decodes the column address and provides the decoder column address to an I/O gating circuit 24 to activate one or more bit lines in the memory array. In this manner, one or more memory cells associated with the activated word line and the activated bit lines are made available for either read, write or erase operation. In practice, the memory device activates the memory cells associated with all of the I/Os of the memory device. For example, the memory cells associated with one word of data or sixteen I/Os, may be activated for access based on the input address.

In the present illustration, the memory array 12 is organized as N+1 banks of memory cells, each bank storing K words of P-bit memory data. For example, the memory array 12 may be organized as 8 banks of 8Meg words of 16-bit memory data. FIG. 2 illustrates a memory bank n of the memory device 60 organized as K words of 16-bit memory data in one example. To implement ECC, the memory array 12 of the memory device 60 includes a main memory array 13 for storing memory data and an ECC memory array 14 for storing ECC check bits.

The memory device 60 further includes a sense amplifier 22 to facilitate read out of stored memory data, including the ECC check bits. The sense amplifier 22 may include a bank of sense amplifier circuits for a set of I/Os. Memory data read out of the main memory array 13 is stored in read registers 26 while the corresponding ECC check bits read out of the ECC memory array 14 are provided to an ECC decoder 28 for processing. The read out data from the read registers 26 and the processed ECC check bits from ECC decoder 28 are provided to an ECC logic circuit 30 to perform error checking and correction. In particular, the ECC logic circuit 30 calculates check bits from the read out data and compares the calculated check bits with the processed check bits read from the ECC memory array 14 to detect and correct bit errors in the read out data. The read out data, which may or may not be error corrected, is then provided to a data output circuit 32 which provides the read out data as the output data DQ on the data terminal 54. The data output circuit 32 may provide buffering or clocking functions. In some embodiments, the ECC logic circuit 30 determines if an error correction event has occurred. In some examples, the ECC logic circuit 30 may use Hamming Code logic and the ECC logic circuit would determine if the data was corrected by the Hamming Code or not.

To write data into the memory device 60, the memory device 60 further includes write drivers 34 configured to receive input memory data DQ on data terminal 54. The write drivers 34 may include a bank of write driver circuits for a set of I/Os. The write data from the write drivers 34 is coupled through sense amplifier 22 to be written into the main memory array 12. Meanwhile, the write data is also provided to an ECC check bit generation circuit 36 (or "ECC check bit generator") to generate the ECC check bits for the data being written into the memory array 13. The corresponding ECC check bits are then stored in the ECC memory array 14. In some embodiments, the ECC check bit generation circuit 36 may use a Hamming Code as the error correction code.

The memory device 60 includes a control circuit 40 to control the operation of the memory device. In some configurations, commands for the memory device 60 are also received on the address/command input terminal 52 and such operational commands are provided to the control circuit 40. Control circuit 40 is in communication with the various circuit elements in memory device 60 to control the memory device in response to the received commands, such as to read data, to write data, or to configure the memory device. The control circuit 40 includes an error correction control circuit 47 (or "ECC control circuit") used to control or configure the ECC functions of the memory device 60 via the Serial Data Bus 70. For example, the ECC control circuit 47 may be used to turn the ECC function of the memory device 60 on and off, or to turn on or off the external ECC pin 56, and various other functions. The ECC control circuit 47 may also be used to read the ECC status, the memory location of ECC Events, and to clear the ECC event status. The control circuit includes mode registers 45 used to store configuration information for the memory device. Mode registers 45 are sometimes referred to as "control registers" and are used to store values for controlling various operational functions and features of the memory device, such as how the memory device should be addressed and the functions of the input/output pins of the memory device.

In some embodiments, the control circuit 40 is configured to control the ECC decoder 28 and the ECC check bit generator 36 through a control bus 38. In one example, ECC control circuit 47 in the control circuit 40, in response to commands received on the input terminal 52 or ECC configuration information stored in the mode register cells, generates the control signal to turn the ECC function on or off, that is, to enable or disable the ECC function. In other words, the control circuit 40 can be configured to enable or disable the ECC decoder 28 and the ECC check bit generator 36.

In embodiments of the present invention, the error correction event notification method is implemented in the memory device 60 using the reserved or unused mode register cells in the mode registers 45 for error correction event notification and for error correction function configuration information. In this manner, error correction event notification can be provided using existing circuit elements in the memory device, without requiring modification of or addition to the memory device circuitry. In the present description, mode registers or mode register cells used for error correction event notification are referred to as "ECC event registers."

FIG. 3 illustrates mode register assignments for a set of mode registers which can be incorporated into the memory device of FIG. 1 to implement the error correction event notification method in embodiments of the present invention. In the present example, the mode register assignments are illustrated for a LPDDR2 DRAM and are extended from the JEDEC standard. The mode register assignments in FIG. 3 are illustrative only and are not intended to be limiting. The error correction event notification method can be applied in other memory devices having other mode register assignment configuration.

In some embodiments, the ECC event registers include an ECC On/Off mode register cell which is used to configure the ECC function by enabling or disabling the ECC function. The ECC event registers may further include a PIN mode register cell which is used to assign a pin or input/output terminal of the memory device as the ECC event notification pin. The memory device 60 may designate a pin, such as ECC pin 56, for use as an ECC event notification and may make use of previously unused or no-connect pin. In the present embodiment, the ECC logic circuit 30 controls the ECC pin 56 to provide the ECC event notification. In other embodiments, the ECC pin 56 may be controlled indirectly by the ECC logic circuit. There may be intervening circuitry between the ECC logic circuit 30 and the ECC pin 56. Furthermore, in some embodiments, the ECC pin 56 may be initialized to a first state (e.g., 0V) and may be asserted to a second state (e.g., 5V) in response to the ECC event signal generated by the ECC logic circuit 30.

More specifically, referring to FIG. 3, the set of mode registers 100 includes mode registers 0 to 15 with each mode register include eight mode register cells OP0 to OP7. Mode registers 100 store values which are used to configure various operational features of the memory device, such as the operational mode of the memory device and/or the functions of one or more pins of the memory device. In the present example, mode register MR0 is assigned to store device information and mode register cells OP0 and OP1 are assigned to hold device information values DAI and DI. The remaining mode register cells are left unused or reserved. In another example, mode register MR1 is assigned to store device feature set 1 and all of the mode register cells OP0 to OP7 are assigned to feature configuration values. Under any given standard, the mode registers will include a number of unused or reserved mode registers or mode registers cells. For example, mode registers MR11 to MR15 are reserved and not used. In the present illustration, the unused or reserved register cells are illustrated as shaded.

In embodiments of the present invention, the error correction event notification method makes use of the unused or reserved mode register cells to store error correction related information. In this manner, the error correction event notification method can control the operation state of the event notification method, including initializing states, monitoring error correction events, recording events and resetting states. The error correction event notification method can further make use of the unused or reserved mode register cells to assign an external pin of the memory device for error correction event notification.

In the embodiment shown in FIG. 3, the mode registers 100 includes mode register cells that are configured for ECC event notification. Specifically, mode register cell OP7 in mode register MR0 is assigned to provide an error correction event (or "ECC Event") notification. The ECC Event mode register cell is a read only cell for external systems. The ECC Event mode register cell has a first value (e.g., "0") to indicate no error correction event has occurred and a second value (e.g., "1") to indicate an error correction event has occurred. In embodiments of the present invention, the ECC logic circuit 30 (FIG. 1) asserts the ECC event signal which is coupled to the mode registers. When an ECC event is detected, the ECC event signal will be asserted to write the ECC Event mode register cell to the second value ("1"). In this manner, a system using the memory device, through its firmware, may monitor the ECC Event mode register cell for the occurrence of an error correction event. In particular, the system may use standard register access method to read the value of the ECC Event mode register cell.

The mode registers 100 further make use of the reserved mode registers MR11 to MR15 to provide information related to an error correction event. In one embodiment, mode register cell OP1 in mode register MR11 is assigned a value "PIN" which is used to assign a pin or input/output terminal of the memory device as the ECC event notification pin. The PIN mode register cell is a write only cell by external systems. The PIN mode register cell is written to a first value (e.g., "0") to indicate no external pin is used for event notification and is written to a second value (e.g., "1") to indicate the ECC event notification should be provided to an external pin of the memory device. The system, through its firmware, may write to the PIN mode register cell if ECC event notification on an external pin is desired. The memory device may designate a pin for use as an ECC event notification and may make use of previously unused or no-connect pin. For example, as shown in FIG. 1, an ECC terminal 56 (FIG. 1) is designated as the ECC event notification pin ("ECC pin"). When the PIN mode register cell has been written to the second value ("1") by an external system, the ECC pin will be asserted in response to the ECC event signal being asserted. In the example shown in FIG. 1, the ECC logic circuit 30 controls the ECC pin 56 to provide the ECC event notification. In other embodiments, the ECC pin 56 may be controlled indirectly by the ECC logic circuit. There may be intervening circuitry between the ECC logic circuit 30 and the ECC pin 56. Furthermore, in some embodiments, the ECC pin may be initialized to a first state (e.g., 0V) and may be asserted to a second state (e.g., 5V) in response to the ECC event signal generated by the ECC logic circuit 30.

In this manner, a system or a user can use standard register access to read the ECC Event mode register to monitor for ECC events. Alternately, the system or user can write to the PIN mode register cell and use the designated ECC pin to monitor the ECC notification. This allows for external hardware to recognize the event and allows for external processors to create Interrupt routines for external events instead of monitoring them in DRAM operations registers.

In one embodiment, mode register MR12 is used to store the values indicating the memory bank in which the ECC event occurred. In the present embodiment, mode register cells OP0 to OP7 are used to indicate which of the 8 memory banks is associated with the ECC event. The Memory Bank ID mode register cells are read only cells for external systems. Each of the Memory Bank ID mode register cells has a first value (e.g., "0") to indicate no error correction event in that bank and a second value (e.g., "1") to indicate an error correction event has occurred in that bank. In embodiments of the present invention, in response to the ECC logic circuit 30 (FIG. 1) providing the ECC event signal, the Memory Bank ID mode register cell associated with the memory bank ID of the current address being accessed is written to the second value ("1"). In this manner, a system using the memory device, through its firmware, may use standard register access method to read the value of the Memory bank ID mode register cells to determine the memory bank in which an error correction event has occurred.

In one embodiment, mode registers MR13 and MR14 are used to store the address values indicating the memory address location in which the ECC event occurred. In the present embodiment, the memory array is assumed to be organized in 8 banks of 16-bit words. Accordingly, the mode register MR13 stores the upper 8-bit of the memory address (ADDR-H) while the mode register MR14 stores the lower 8-bit of the memory address (ADDR-L). In this manner, a system using the memory device, through its firmware, may use standard register access method to read the value of the ADDR-H and ADDR-L mode register cells to determine the memory address location in which an error correction event has occurred.

In one embodiment, mode register cell OP0 in mode register MR11 ("CLR ECC") is used to clear the ECC event notification. The CLR ECC mode register cell is a write only cell by the external system. The CLR ECC mode register cell is written to a first value (e.g., "0") for no action taken and is written to a second value (e.g., "1") to reset or clear the ECC event registers, such as to set the ECC Event mode register cell to the reset value ("0") and to reset the ECC pin. Furthermore, the Memory Bank ID cells, the ADDR-H and ADDR-L mode register cells are also reset to their initial state or to null value when cleared by the CLR ECC mode register cell. An external system can use standard register access to write to the CLR ECC mode register cell to clear the ECC event registers and also to reset the ECC pin.

In operation, the error correction event notification method responds to the occurrence of an error correction event by setting the ECC Event mode register cell or providing ECC event notification on the ECC pin, or by recording the memory bank ID and the memory address. The external system may then monitor the ECC event mode register cell, or monitor the ECC pin for the occurrence of an error correction event. The external system can collect ECC event data over time to determine if the same memory address or the same memory bank is experiencing repeated ECC correction which can indicate a serious enough problem with the memory device. The external system may then generate an alert to service the system.

In some embodiments of the present invention, the memory device 60 is implemented with an ECC control function to enable the ECC function to be turned on or off. Referring back to FIG. 1, the control circuit 40 is configured to control the ECC decoder 28 and the ECC check bit generator 36 through a control bus 38. The control circuit 40, in response to commands received on the input terminal 52, provides the control signal to turn the ECC function on or off, that is, to enable or disable the ECC function. In other words, the control circuit 40 can be configured to enable or disable the ECC decoder 28 and the ECC check bit generator 36. In some embodiments, the mode registers 45, besides storing error correction event notification information, the mode registers may also be configured to store error correction configuration information. For example, the control circuit 40 includes a mode register cell in the mode registers 45 to store configuration information for the ECC on/off function. For example, referring to FIG. 3, mode register 100 may be configured to include a mode register cell for controlling the on and off status of the ECC function. Specifically, in the present example, mode register cell OP7 in mode register MR11 is assigned to provide an error correction function on and off status (ECC On/Off). The ECC On/Off mode register cell has a first value (e.g., "0") to indicate that the error correction function is disabled and a second value (e.g., "1") to indicate that the error correction function is enabled. In particular, an external system may use standard register access method to write the value of the ECC On/Off mode register cell to control the enable or disable status of the ECC function. The control circuit 40, in response to the value of the ECC On/Off mode register cell, controls the ECC decoder 28 and the ECC check bit generator 36 through a control bus 38 to turn the ECC function on or off In the above described embodiments, the ECC event registers are implemented in the unused or reserved mode register cells of the control registers of the control circuit. In this manner, the error correction event notification method can be implemented in legacy memory devices without requiring modification to the memory device circuitry. In other embodiments, the memory device may be configured with additional registers that are specifically designated for use as the ECC event registers. These additional registers are also referred to as "special purpose registers." The error correction event notification method of the present invention may be applied to memory devices that are provided only with control registers where the unused or reserved mode registers are designated as ECC event registers. Alternately, the error correction event notification method of the present invention may be applied to memory devices that are provided with additional special purpose registers in addition to the control registers where the special purpose registers are designated as the ECC event registers for ECC event notification. Regardless of the mode register configuration, the error correction event notification method of the present invention enables access to the mode register cells through the use of a serial data bus 70.

Accordingly, in the present embodiment, the memory device 60 includes a serial data bus 70 configured to interface or communicate with the control circuit 40. In one embodiment, the serial data bus 70 is a Serial Peripheral Interface (SPI) bus. The SPI bus 70 is a four-wire bus carrying four logic signals: SCLK as the serial clock, MOSI as the serial data input, MISO as the serial data output, and /SS as the serial bus enable signal. The SPI bus 70 may be controlled under the signaling convention of the SPI specification. An external system may access the error correction event notification information stored in the mode registers 45 of the control circuit 40 through the use of the serial data bus 70. In particular, an external system may use the serial data bus 70 to clear or reset the ECC event registers. The external system may use the serial data bus 70 to access the ECC event registers to retrieve the values stored in the ECC event registers, such as the ECC Event indicator, or the memory bank ID or the memory address stored therein. Finally, the external system may use the serial data bus 70 to control the ECC functions of the memory device through the ECC control circuit 47, such as to turn the ECC function of the memory device on or off. The ability to control the ECC functions of the memory device is particularly useful to meet the requirements of industrial standards requiring testing of the functionality of the ECC circuitry in the memory device, as will be explained in more detail below.

During the memory operation of the memory device 60, the error correction event notification method may respond to the occurrence of an error correction event by setting the ECC Event mode register cell or providing ECC event notification on the ECC pin, and by recording the memory bank ID and the memory address in the designated mode register cells. An external system may monitor the ECC Event mode register cell or monitor the ECC pin for the occurrence of an error correction event. In particular, the external system may access the ECC event registers through the serial data bus 70 to access the ECC Event mode register cell and the mode register cells storing the memory bank ID and the memory address.

Figure 4:
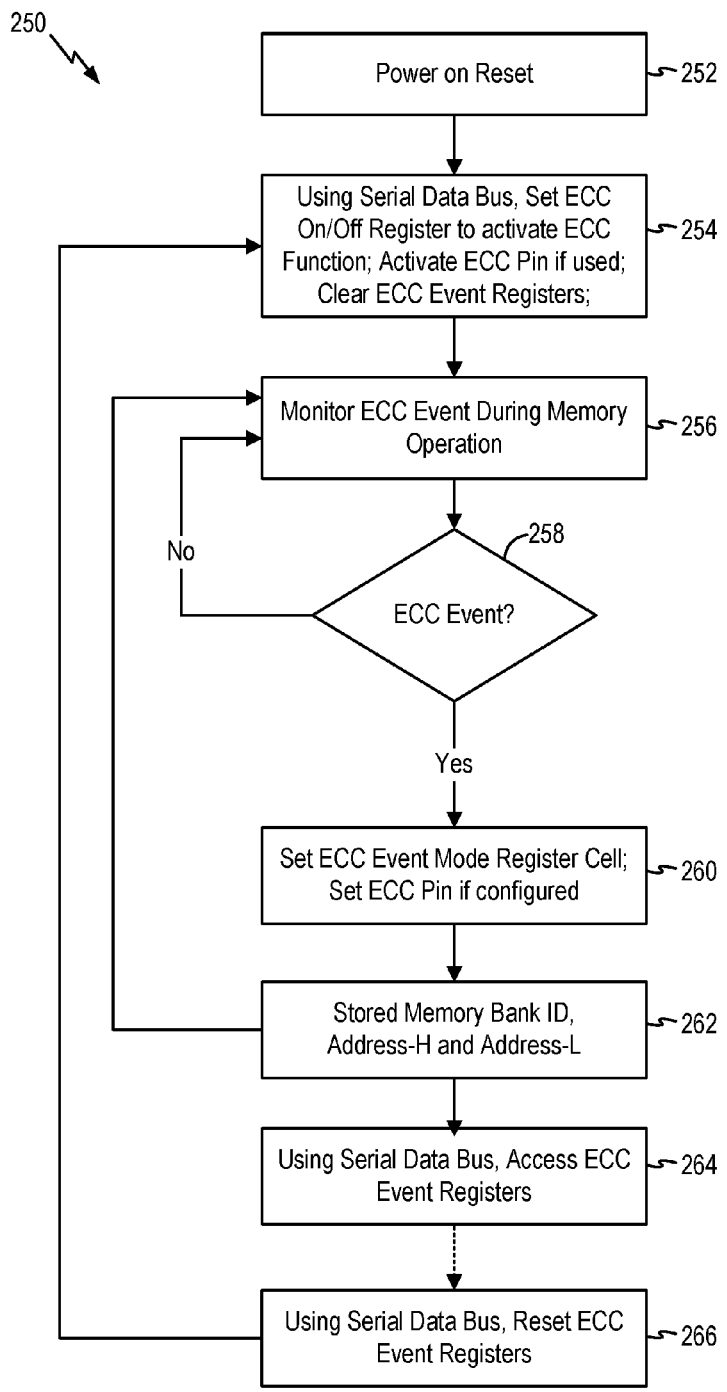
FIG. 4 is a flowchart illustrating the error correction event notification method using a serial bus interface in a memory device implemented with error correction in an alternate embodiment of the present invention.

FIG. 4 is a flowchart illustrating the error correction event notification method using a serial bus interface in a memory device implemented with error correction in an alternate embodiment of the present invention. Referring to FIG. 4, in response to a power on reset event at the memory device (252), the error correction event notification method 250 write to the ECC On/Off mode register cell using the serial data bus to activate or enable ECC function (254). In some embodiments, the method 250 may also write to the PIN mode register cell using the serial data bus to activate the ECC pin if the pin is used. The method 250 clears the ECC event registers using the serial data bus to access the ECC event registers. As such, the ECC pin is initialized and the other ECC event registers are set to their initial states. For example, the ECC pin, if used, is set to a reset state indicating no ECC event and the ECC Event mode register cell (FIG. 3) is set to the first state ("0"). Furthermore, the Memory Bank ID cells, the ADDR-H cells, and the ADDR-L cells are reset to their initial states ("0") or null value. Then, the method 250 monitors for the occurrence of ECC events during memory operation (256). For example, the method 250 monitors for the occurrence of ECC events during memory read operations. In one embodiment, the method 250 monitors the ECC event signal from the ECC logic circuit (FIG. 1) for the occurrence of an ECC event. The method 250 determines if an ECC event has occurred (258). When no ECC event is reported, the method 250 repeats at 256 to continue to monitor for ECC event occurrence during the memory operation.

When an ECC event has occurred, such as indicated by the ECC event signal being asserted by the ECC logic circuit, the method 250 then set the ECC Event mode register cell to the second state ("1") indicating the occurrence of an ECC event (260). If an ECC pin has been configured by the PIN mode register cell, the method 250 also set the ECC pin to an asserted state to indicate the occurrence of an ECC event. Next, the method 250 stores the memory bank ID and the memory address location into the respective mode registers (262). For example, the memory bank ID is stored in the respective Memory Bank ID mode register cell, the upper p-bit of the memory address is stored in the ADDR-H mode register cells and the lower p-bit of the memory address is stored in the ADDR-L mode register cells.

After recording an ECC event, the method 250 continues at 256 to monitor for ECC events during the memory operation. Subsequent ECC events will be recorded in the mode register cells by overwriting of previous data. With the error correction event notification information thus stored in the ECC event registers, the method 250 enables the ECC event registers to be accessed through the serial data bus (264).

In some cases, the external system may want to reset the values of the error correction event registers. In that case, the external system may, through the serial data bus, write to the CLR ECC mode register cell to clear or reset the values of the ECC event registers (266). When the CLR ECC mode register cell is written to the second state ("1"), the method 250 returns to 254 where the ECC pin, if used, and the ECC event registers are cleared. That is, the ECC Event mode register cell, the Memory Bank ID cells, the ADDR-H cells, and the ADDR-L cells are all reset to their initial states ("0") or null value, and the ECC pin, if used, is initialized. The method 250 then continues with monitoring the ECC event 256 during memory operation.

As described above, the error correction event notification method of the present invention may be implemented in a memory device using special purpose mode registers in the control circuit, instead of the unused or reserved mode register cells of the control registers. FIG. 5 illustrates mode register assignments for a set of mode registers which can be incorporated into the memory device of FIG. 1 to implement the error correction event notification method using a serial bus in embodiments of the present invention. Referring to FIG. 5, a set of mode registers 300 includes mode registers 0 to 7 with each mode register include eight mode register cells OP0 to OP7. Mode registers 300 are special purpose registers designated for use as the ECC event registers. Accordingly, the mode register cells may be assigned as needed to store error correction event notification information and error correction function configuration information.

In mode registers 300 as shown in FIG. 5, the mode register cell OP0 in mode register MR0 is assigned to provide an error correction event (or "ECC Event") notification. The ECC Event mode register cell is a read only cell for external systems. The ECC Event mode register cell has a first value (e.g., "0") to indicate no error correction event has occurred and a second value (e.g., "1") to indicate an error correction event has occurred. In embodiments of the present invention, the ECC logic circuit 30 (FIG. 1) asserts the ECC event signal which is coupled to the mode registers 300. When an ECC event is detected, the ECC event signal will be asserted to write the ECC Event mode register cell to the second value ("1"). In this manner, an external system using the memory device, through its firmware, may monitor the ECC Event mode register cell for the occurrence of an error correction event. In particular, the external system may use the serial data bus 70 (FIG. 1) to read the value of the ECC Event mode register cell.

In mode registers 300, mode register cell OP7 in mode register MR2 is assigned a value "PIN" which is used to assign a pin or input/output terminal of the memory device as the ECC event notification pin. The PIN mode register cell is a write only cell by external systems. The PIN mode register cell is written to a first value (e.g., "0") to indicate no external pin is used for event notification and is written to a second value (e.g., "1") to indicate the ECC event notification should be provided to an external pin of the memory device. The external system, through its firmware, may write to the PIN mode register cell if ECC event notification on an external pin is desired. For example, as shown in FIG. 1, an ECC terminal 56 is designated as the ECC event notification pin ("ECC pin"). When the PIN mode register cell has been written to the second value ("1") by an external system, the ECC pin will be asserted in response to the ECC event signal being asserted. In this manner, the system or user can write to the PIN mode register cell and use the designated ECC pin to monitor the ECC notification.

In one embodiment, mode register MR4 is used to store the values indicating the memory bank in which the ECC event occurred. In the present embodiment, mode register cells OP0 to OP7 in the mode register MR4 are used to indicate which of the 8 memory banks is associated with the ECC event. The Memory Bank ID mode register cells are read only cells for external systems. Each of the Memory Bank ID mode register cells has a first value (e.g., "0") to indicate no error correction event in that bank and a second value (e.g., "1") to indicate an error correction event has occurred in that bank. In embodiments of the present invention, in response to the ECC logic circuit 30 (FIG. 1) providing the ECC event signal, the Memory Bank ID mode register cell associated with the memory bank ID of the current address being accessed is written to the second value ("1"). In this manner, an external system using the memory device, through its firmware, may use the serial data bus 70 to read the value of the Memory bank ID mode register cells to determine the memory bank in which an error correction event has occurred.

In one embodiment, mode registers MR5 and MR6 are used to store the address values indicating the memory address location in which the ECC event occurred. In the present embodiment, the memory array is assumed to be organized in 8 banks of 16-bit words. Accordingly, the mode register MR5 stores the upper 8-bit of the memory address (ADDR-H) while the mode register MR6 stores the lower 8-bit of the memory address (ADDR-L). In this manner, an external system using the memory device, through its firmware, may use the serial data bus 70 to read the value of the ADDR-H and ADDR-L mode register cells to determine the memory address location in which an error correction event has occurred.

In one embodiment, mode register cell OP4 in mode register MR1 ("CLR ECC") is used to clear the ECC event notification. The CLR ECC mode register cell is a write only cell by the external system. The CLR ECC mode register cell is written to a first value (e.g., "0") for no action taken and is written to a second value (e.g., "1") to reset or clear the ECC event registers, such as to set the ECC Event mode register cell to the reset value ("0") and to reset the ECC pin. Furthermore, the Memory Bank ID cells, the ADDR-H and ADDR-L mode register cells are also reset to their initial state or to null value when cleared by the CLR ECC mode register cell. An external system can use the serial data bus 70 to write to the CLR ECC mode register cell to clear the ECC event registers and also to reset the ECC pin.

Finally, in one embodiment, mode register cell OP7 in mode register MR0 ("ECC On/Off") is used to enable or disable the ECC function. The ECC On/Off mode register cell is a write only cell by the external system. The ECC On/Off mode register cell has a first value (e.g., "0") to indicate that the error correction function is disabled and a second value (e.g., "1") to indicate that the error correction function is enabled. In particular, an external system may use the serial data bus to write the value of the ECC On/Off mode register cell to control the enable or disable status of the ECC function. The ECC control circuit 47 in the control circuit 40, in response to the value of the ECC On/Off mode register cell, controls the ECC decoder 28 and the ECC check bit generator 36 through the control bus 38 to turn the ECC function on or off.

As described above, under the ISO26262 standard, a memory device implementing ECC function must be provided with the ability to demonstrate that the ECC function works properly. The testing scheme for the ECC function requires the ability to turn the ECC function on and off in the memory device. In embodiments of the present invention, the testing scheme uses the ECC On/Off mode register cell to instruct the control circuit of the memory device to enable or disable the ECC function, as described above. For example, as shown in FIG. 1, the control circuit 40 may control the ECC decoder 28 and the ECC check bit generator 36 through a control bus 38 in response to the value of the ECC On/Off mode register cell to turn the decoder or check bit generator circuits on or off.

In some embodiments, a testing scheme for the ECC function in a memory device includes turning on the ECC function of the memory device and writing a first data pattern to pre-determined memory locations in the memory device with the ECC function enabled. Then, the testing scheme includes turning off the ECC function and writing a second data pattern to a subset of the pre-determined memory locations in the memory device with the ECC function disabled where the second data pattern is different from the first data pattern. Then, the testing scheme includes turning on the ECC function again and reading the pre-determined memory locations. The read result should include ECC errors in the subset of memory locations where different data values were written without generating the ECC check bits. In this manner, the testing scheme simulates the occurrence of data corruption event and enables the ECC function of the memory device to be verified as operational. For example, as a result of the testing scheme, an ECC event notification should thus be generated and the memory location of the ECC event should be recorded in the mode register cells.

In embodiments of the present invention, the serial data bus 70 provided to the memory device 60 facilitates the testing of the ECC function by enabling the ECC function to be turned on and off through accessing the ECC control circuit 47 in the control circuit 40 using the serial data bus 70. In some embodiment, the ECC On/Off mode register cell is written by the serial data bus 70 to configure the ECC function. Furthermore, the ECC event notification data stored in the mode registers 45 can be read through the serial data bus to verify the correct functionality of the ECC function in the memory device.

ECC Event Notification Using an I²C Serial Data Bus

Figure 6:
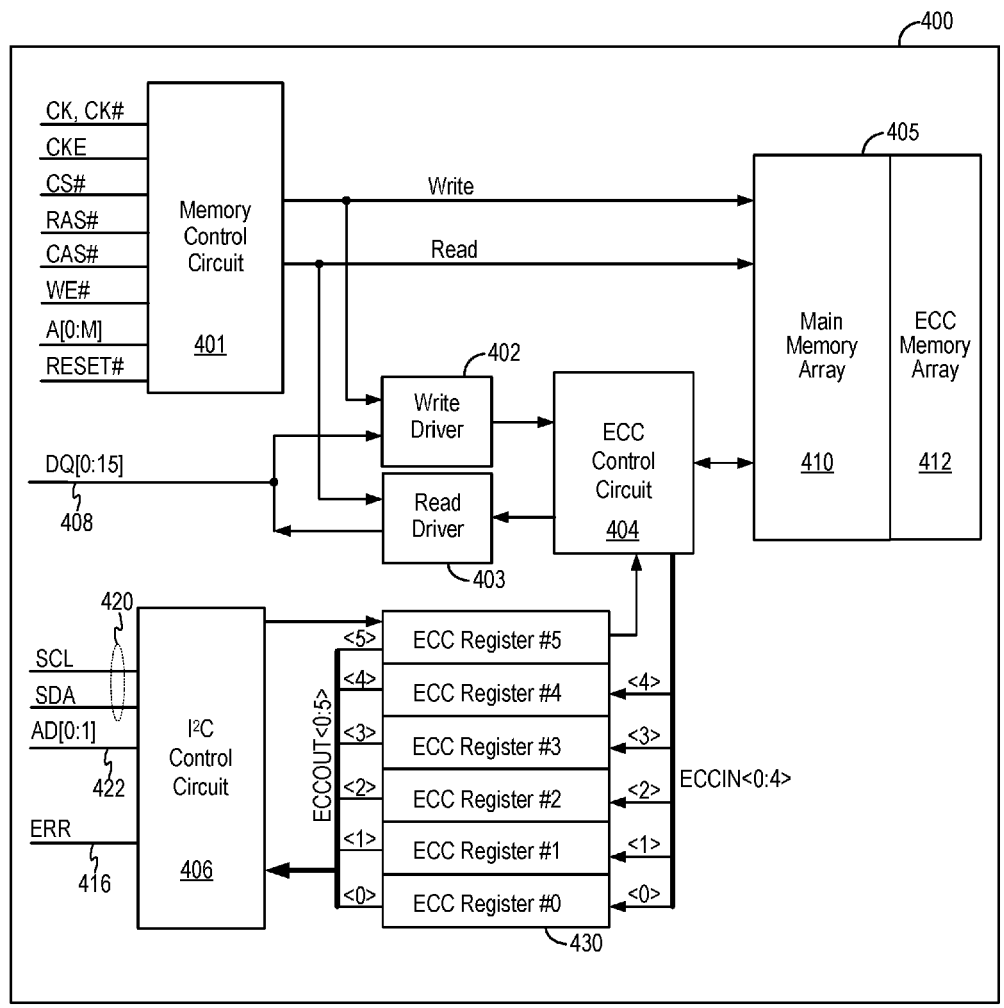
FIG. 6 is a block diagram of a memory device implementing an error correction event notification method using an I2C serial data bus interface in embodiments of the present invention.

In some embodiments, a memory device, such as a DRAM, includes a parallel data bus for memory data and address/command and an I²C serial data bus for error correction event notification and information. FIG. 6 is a block diagram of a memory device implementing an error correction event notification method using an I²C serial data bus interface in embodiments of the present invention. Referring to FIG. 6, a memory device 400 includes a memory array 405 for storing memory data. The memory device 400 includes a memory control circuit 401 to receive control signals for operating the memory device. For example, the memory control circuit 401 receives an input address A[0:M] to access a memory location in the memory array 405. The memory control circuit 401 further receives command signals to control the operation of the memory device. For example, the memory control circuit 401 may receive a clock signal CK, a chip select signal CS, a write enable signal WE and other command signals associated with the operation of the memory device. More specifically, the memory control circuit 401 of the memory device 400 receives input address and command signals and is configured to control the operation of the memory device 400. The memory control circuit 401 is in communication with the various circuit elements in memory device 400 to control the memory device in response to the received commands, such as to read data, to write data, or to configure memory device.

The memory device 400 further includes a data terminal 408 being a P-bit input/output data terminal to receive input memory data and to provide output memory data (or read out data). Thus, the P-bit memory data DQ may be write data or read data depending on the operation mode of the memory device. In the present embodiment, the memory data DQ is a 16 bit memory data DQ[0:15]. The data terminal 408 is connected to a write driver 402 for receiving write data to be written to the memory array. The data terminal 408 is also connected to a data out driver 403 for receiving read data from the memory array 405 and providing read out data to the data terminal 408. In the present embodiment, the address and command signals and the data terminal 408 are configured as parallel data buses. The input address A[0:M] or commands are received on a parallel data bus. Meanwhile, the P-bit memory read/write data DQ[0:15] are received or provided on a P-bit parallel data bus as the data terminal 408.

The memory device 400 in FIG. 6 is an example representation of a random access memory device, such as a DRAM device. The configuration of memory device 400 in FIG. 6 is illustrative only and is not intended to be limiting. The memory device 400 may include other elements or components not shown in FIG. 6 for simplicity reasons. Furthermore, the memory device 400 is a monolithic memory integrated circuit, or a standalone memory chip. The address and command input signals and the data terminal 408 are formed as multiple input or input-output pins on the integrated circuit. The memory integrated circuit may include other input and output terminals not shown in FIG. 6 for simplicity reasons. For example, the memory integrated circuit may include input-output pins for the power and ground connections and for other control signals.

In the present embodiment, the memory device 400 implements ECC as the error correction technique to recover form bit errors in the memory array. In some embodiments of the present invention, the memory device 400 is a low power double data rate synchronous DRAM, or LPDDR2 SDRAM. The memory device 400 implements the error correction event notification method described above to enable the DRAM or SDRAM device to provide notification of an occurrence of an error correction event during data read out. In this manner, the DRAM or SDRAM device can be implemented in systems requiring compliance with intentional standards, such as the ISO26262 standard, which require systems to be aware of the occurrence of an error correction event in a memory device incorporated therein.

Referring still to FIG. 6, the memory control circuit 401 of the memory device 400 includes address latch and address decoder circuits (not shown) to latch and decode the input address A[0:M]. The address decoder circuits typically include a row decoder and a column decoder. The row decoder decodes the row address and provides the decoded row address to the memory array 405 to activate an associated word line in the memory array. The column decoder decodes the column address and provides the decoded column address to activate one or more bit lines in the memory array 405. In this manner, one or more memory cells associated with the activated word line and the activated bit lines are made available for either read, write or erase operation. In practice, the memory device activates the memory cells associated with all of the I/Os of the memory device. For example, for memory data DQ[0:15], the memory cells associated with one word of data or sixteen I/Os, may be activated for access based on the input address. In some examples, the memory array 405 may be organized as N+1 banks of memory cells, each bank storing K words of P-bit memory data, as described above with reference to FIGS. 1 and 2. The exact configuration of the memory array 405 is not critical to the practice of the present invention.

To implement ECC, the memory array 405 of the memory device 400 includes a main memory array 410 for storing memory data and an ECC memory array 412 for storing ECC check bits. ECC check bits for a corresponding memory location are stored in the ECC memory array 412 when write data is received and written to the main memory array 410. ECC check bits for a corresponding memory location are retrieved from the ECC memory array 412 when read data is retrieved from the main memory array 410. The memory device 400 further includes an ECC control circuit 404 coupled to the memory array 405 for performing the ECC operations.

To write data into the memory device 400, the memory device 400 includes the write driver 402 configured to receive input memory data DQ[0:15] on data terminal 408. The write driver 402 may include a bank of write driver circuits for a set of I/Os. The write data from the write driver 402 is provided to the ECC control circuit 404 to generate the ECC check bits. In particular, the ECC control circuit 404 may include an ECC check bit generation circuit or "ECC check bit generator" (not shown) to generate the ECC check bits for the data being written into the memory array 410. The write data is then written into the main memory array 410 and the corresponding ECC check bits are stored in the ECC memory array 412. In some embodiments, the ECC check bit generator may use a Hamming Code as the error correction code.

To read data from the memory device 400, the memory device 400 includes a sense amplifier (not shown) coupled to the memory array 405 to facilitate read out of stored memory data, including the ECC check bits. The sense amplifier may include a bank of sense amplifier circuits for a set of I/Os. Memory data read out of the main memory array 410 and the corresponding ECC check bits read out of the ECC memory array 412 are provided to the ECC control circuit 404. In particular, the ECC control circuit 404 may include read registers to store the read out data and an ECC decoder to decode the retrieved ECC check bits. The read out data and the decoded ECC check bits are then processed to perform error checking and correction. For example, the ECC control circuit 404 may calculate check bits from the read out data and compares the calculated check bits with the decoded check bits read from the ECC memory array 412 to detect and correct bit errors in the read out data. The read out data is corrected if a bit error is detected. The read out data is not corrected if no bit error is detected. The read out data, which may or may not be error corrected, is then provided to the data our driver 403 which provides the read out data as the output data DQ[0:15] on the data terminal 408. The data our driver 403 may provide buffering or clocking functions. In some embodiments, the ECC control circuit 404 determines if an error correction event has occurred in the read out data. In some examples, the ECC control circuit 404 may use Hamming Code logic and the ECC control circuit would determine if the data was corrected by the Hamming Code or not.

In embodiments of the present invention, the memory device 400 implements the error correction event notification method using an I2C control circuit 406 coupled to an I2C (or I²C) Serial Data Bus 420 and a set of ECC registers 430 in communication with the I2C control circuit 405 and the ECC control circuit 404. The I2C control circuit 406 receives control signals from the I2C Serial Data Bus 420 to configure the ECC function in the memory device and also to obtain information concerning ECC events from the memory device. For example, the I2C control circuit 406 may be used to turn the ECC function of the memory device 400 on or off, or to turn on or off an external ERR pin 416, and various other functions. The I2C control circuit 406 may also be used to read ECC event information from the ECC registers 430, such as the ECC event status, the memory location of ECC Events, and to clear the ECC event status. In the present embodiment, the memory device 400 uses a bank of special purpose registers as the ECC registers 430 for storing ECC control information and ECC event information. In other embodiments, the memory device 400 may use the reserved or unused registers in the control registers of the memory device 400 as the ECC registers, as described above.

In embodiments of the present invention, an external system, such as a host computer or a memory controller, can access the ECC registers 430 using the I2C serial data bus 420 to obtain ECC event notification and event information. The I2C serial data bus 420 is coupled to the I2C control circuit 406 which in turns is in communication with the ECC registers 430. The I2C control circuit 406 may receive control data on the I2C serial data bus 420 and writes the control data to specific registers of the ECC registers 430 to control the ECC operation at the ECC control circuit 404. In one example, the I2C control circuit 406 writes control data to a first ECC register to turn the ECC function on or off. The ECC control circuit 404, in response to the control data stored in the first ECC register, generates the control signal to turn the ECC function on or off, that is, to enable or disable the ECC function. In other words, the ECC control circuit 404, through the control data stored in the ECC registers 430, can be configured to enable or disable the ECC decoder and the ECC check bit generator therein so as to control the ECC function in the memory device 400. In another example, the I2C control circuit 406 may receive command data on the I2C serial data bus 420 to read out data stored in the ECC registers 430. In this manner, ECC event information may be read and provided to a system external to the memory device. Furthermore, ECC event information may be accessed during normal memory operation of the memory device and without interfering with the operation of the memory device.

Meanwhile, the ECC control circuit, in communication with the ECC registers 430, performs error correction for the memory device 400 in accordance with the configuration or control data stored in the ECC registers. Furthermore, the ECC control circuit 404 is configured to store information relating to an occurrence of an error correction event into the ECC registers 430. For example, the ECC control circuit 404 may store the memory location where ECC correction has been applied. The ECC control circuit 404 may store other ECC event information, such as the type of ECC errors corrected. The ECC event information stored in the ECC registers 430 may be retrieved and provided to an external system, such as a memory controller, through the I2C Serial Data bus 430 in communication with the I2C control circuit 406.

In the present embodiment, the ECC registers 430 is implemented using a set of 6 registers, denoted as ECC Register #0 to ECC register #5, to store error correction event notification information and error correction function configuration information. The I2C control circuit 406 may read from the ECC registers #0 to #5 and may write to the ECC register #5 only while the ECC control circuit 404 may read from the ECC register #5 and may write to the ECC registers #0 to #4.

FIG. 7 illustrates register assignments for the ECC registers which can be incorporated into the memory device of FIG. 6 to implement the error correction event notification method in embodiments of the present invention. Referring to FIG. 7, a set of six 8-bit wide special purpose registers are designated to use as the ECC registers 430. The ECC registers 430 includes six ECC registers, denoted as ECC Register #0 to ECC register #5. Each ECC register includes eight register cells OP0 to OP7. ECC Registers #0 to #4 are read access only registers by the I2C serial data bus. That is, the I2C serial data bus can only read data from these registers but cannot write to the registers. ECC Registers #0 to #4 store data that are written into the register cells by the ECC control circuit 404. ECC Register #5 is a read and write access register by the I2C serial data bus. That is, the I2C serial data bus can write data to and read data from the ECC Register #5.

In the present embodiment, the register cells in ECC Register #0 are assigned as follows: register cells OP5 to OP7 stores a multi-bit error counter, register cells OP2 to OP4 stores a one-bit error counter, register cell OP1 stores an ECC type value and register cell OP0 stores an ECC Event value.

Register cell OP0 in ECC Register #0 is also referred to as the ECC Event register cell and is used to indicate whether an ECC event has occurred in the memory device. The ECC Event register cell is a read only cell for the I2C serial data bus. The ECC Event register cell has a first value (e.g., "0") to indicate no error correction event has occurred and a second value (e.g., "1") to indicate an error correction event has occurred. In embodiments of the present invention, the ECC control circuit 404 (FIG. 6) generates an ECC event signal which is written to the ECC Event register cell. When an ECC event is detected, the ECC event signal will be asserted to write the ECC Event register cell to the second value ("1"). In this manner, an external system using the memory device, through the I2C serial data bus, may monitor the ECC Event register cell for the occurrence of an error correction event. In particular, the external system may use the I2C serial data bus 420 to read the value of the ECC Event register cell to obtain the status of the error correction events.

Register cell OP1 in ECC Register #0 issued to indicate the type of ECC error that has occurred. In particular, the ECC type register cell has a first value (e.g., "0") to indicate a one-bit error correction and a second value (e.g., "1") to indicate aa multiple bit error correction. That is, the ECC type register cell stores an indicator whether the error correction event that has occurred is a one-bit error or a multi-bit error. The ECC Register #0 further stores the count value for one-bit errors (register cells OP2-OP4) and the count value for multi-bit errors (register cells OP5 to OP7).

That is, the one-bit error count register cells store how many single bit errors have occurred on the memory device and the multi-bit error count register cells store how many multiple bit errors have occurred on the memory device.

In the present embodiment, the register cells in ECC Register #1 are assigned to store the memory address location in which the last ECC event has occurred. In particular, register cells OP0 to OP2 in ECC Register #1 store the memory bank address[2:0] indicating the memory bank in which the ECC event occurred. Register cells OP3 to OP7 in ECC Register #1 store the lower five bits of the column address [4:0]. The ECC Register #1 is a read only register by the I2C serial data bus. The bank address and column address values are written into the ECC Register #1 by the ECC control circuit 404.

In the present embodiment, the register cells in ECC Register #2 are assigned to store the upper eight bits of the column address [12:5] in which the last ECC event has occurred. The register cells in ECC Register #3 are assigned to store the lower eight bits of the row address [7:0] in which the last ECC event has occurred. The register cells in ECC Register #4 are assigned to store the upper eight bits of the row address [15:8] in which the last ECC event has occurred. The ECC Registers #2-4 are read only registers by the I2C serial data bus. The column address and row address values are written into the ECC Registers #2-4 by the ECC control circuit 404.

The ECC Register #5 stores values for configuring the ECC operation in the memory device. In the present embodiment, the register cells in ECC Register #5 are assigned as follows: register cell OP4 stores a Clear ECC (CLRECC) value, register cells OP2 to OP3 store an ERR type value, register cell OP1 store an ERRON value, and register cell OP0 store an ECCON value. Register cells OP5 to OP7 are reserved or unused. The register cells in the ECC Register #5 are available for both read and write operations by the I2C serial data bus.

Register cell OP0 in ECC register #5 stores the ECCON value which is used to enable or disable the ECC function in the memory device. The ECCON register cell has a first value (e.g., "0") to indicate that the error correction function should be disabled and a second value (e.g., "1") to indicate that the error correction function should be enabled. In particular, an external system, such as a memory controller, may use the I2C serial data bus to write the value of the ECCON register cell to control the enable or disable status of the ECC function. The ECC control circuit 404 enables or disables the ECC function in response to the value of the ECCON register cell. By writing the ECCON register cell using the I2C serial data bus 420, the ECC function of the memory device 400 may be turned on or off.

Register cell OP1 in ECC register #5 stores the ERRON value which is used to enable or disable an output terminal of the memory device as the ECC event notification pin. In the present embodiment, the memory device 400 includes an ERR terminal 416 to use as the ECC event notification pin. The ERR terminal or pin 416 may be activated or deactivated by writing to the ERRON register cell. The ERRON register cell is written to a first value (e.g., "0") to indicate no external pin is used for event notification and is written to a second value (e.g., "1") to indicate the ECC event notification should be provided to the external pin of the memory device, such as the ERR pin. An external system, through the I2C serial data bus, may write to the ERRON register cell if ECC event notification on an external pin of the memory device is desired. For example, as shown in FIG. 6, the ERR terminal 416 of the memory device 400 is designated as the ECC event notification pin. When the ERRON register cell has been written to the first value ("0") through the I2C serial data bus, the ERR pin is not enabled and no ECC event notification is provided. For example, the ERR pin may be driven to a tri-state or high impedance mode. When the ERRON register cell has been written to the second value ("1") through the I2C serial data bus, the ERR pin is enabled and will be deasserted (e.g. at a logical low level) until an ECC event has occurred. The ERR pin will be asserted (e.g. at a logical high level) in response to an occurrence of an ECC event, such as when the ECC Event register cell is being written to the second value ("1"). In this manner, a host system, or a memory controller can write to the ERRON register cell and use the designated ERR pin to monitor the ECC event notification.

Register cells OP2 and OP3 in ECC Register #5 store an ERR type value to indicate which type of ECC error to be reported on the ERR pin. In embodiments of the present invention, the ERR type is a two-bit value to support the selection of three ERR type choices: one-bit error, multi-bit error or any kind of ECC error. The ERR type register cells [1:0] are written to a first value ("00") to select reporting of one-bit error in the ECC events. The ERR type register cells [1:0] are written to a second value ("01") to select reporting of multi-bit error in the ECC events. The ERR type register cells [1:0] are written to a third value ("10") to select reporting of any type of ECC events, including both one-bit and multi-bit error ECC events.

Register cell OP4 in ECC register #5 stores the CLRECC value which is used to clear the ECC registers. The CLRECC register cell is written to a first value (e.g., "0") for no action taken and is written to a second value (e.g., "1") to reset or clear the ECC registers, such as to set the ECC Event register cell to the reset value ("0"). Furthermore, the memory bank address register cells, the column and row address register cells are also reset to their initial state or to null value when cleared by the CLRECC register cell. An external system can use the I2C serial data bus to write to the CLRECC register cell to clear the ECC registers.

Returning to FIG. 6, as thus configured, the memory device 400 uses the I2C serial data bus 420 to interface or communicate with the memory device to configure the ECC operation and to obtain ECC event notification information. The I2C serial data bus is a two-wire data bus including a first wire carrying the clock input signal SCL and a second wire carrying the data input and output signal SDA. The I2C serial data bus supports multi-master and multi-slave configurations. In some embodiments, a single memory controller may be used to control multiple memory devices. In that case, each of the memory devices will be assigned a unique device address by programming the device address terminal 422 coupled to the I2C control circuit 406 of the memory device 200. In the present embodiment, the device address terminal 422 is configured as a two-bit signal AD[0:1] to allow a memory controller to control up to 4 memory devices connected to the same I2C bus. Instructions transmitted on the I2C bus will identify in the slave address the specific device address so that each memory device processes only instructions designated to it. In other embodiments, the device address terminal 422 may be configured as a multi-bit signal depending on the number of memory devices to be As thus configured in FIG. 6, an external system, such as a memory controller, may access the error correction event notification information stored in the ECC registers 430 through the use of the I2C serial data bus 420. In particular, the external system may use the I2C serial data bus 420 to clear or reset the ECC event registers. The external system may use the I2C serial data bus 420 to access the ECC event registers to retrieve the values stored in the ECC event registers, such as the ECC Event indicator, or the memory bank address and the memory row and column address stored therein. More specifically, during the memory operation of the memory device 400, the error correction event notification method may respond to the occurrence of an error correction event by setting the ECC Event register cell or providing ECC event notification on the ERR terminal, and by recording the memory bank address and the memory address (row and column addresses) in the designated register cells of the ECC registers. In particular, the external system may access the ECC registers through the I2C serial data bus 420 to access the ECC Event register cell and the register cells storing the memory bank address and the memory address of the memory location associated with the ECC corrected memory data.

Finally, the external system may use the I2C serial data bus 420 to control the ECC functions of the memory device through the ECC control circuit 404, such as to turn the ECC function of the memory device on and off. The ability to control the ECC functions of the memory device is particularly useful to meet the requirements of industrial standards requiring testing of the functionality of the ECC circuitry in the memory device, as described above.

Figure 8:
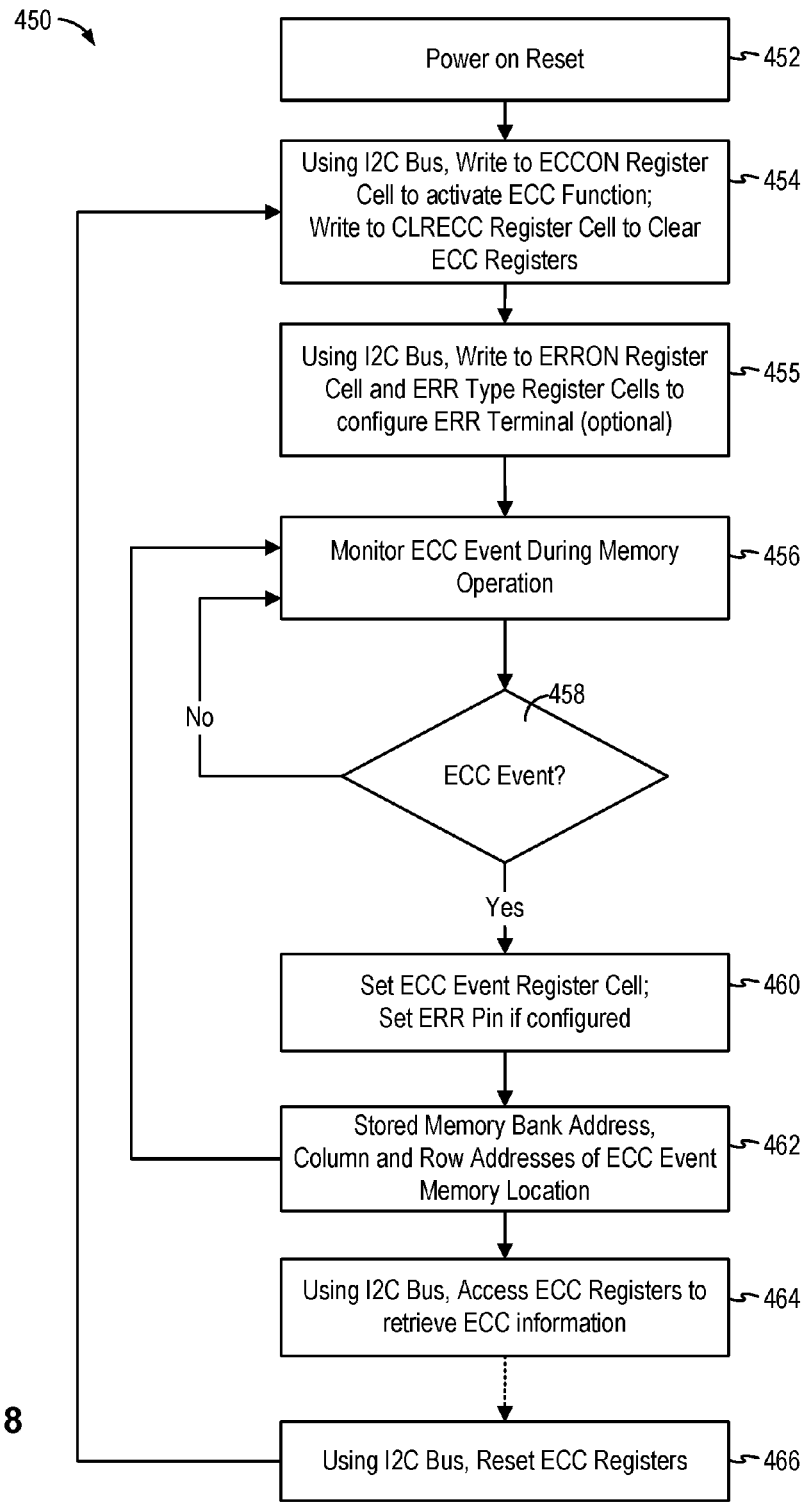
FIG. 8 is a flowchart illustrating the error correction event notification method using an I2C serial bus interface in a memory device implemented with error correction in embodiments of the present invention.

FIG. 8 is a flowchart illustrating the error correction event notification method using an I2C serial bus interface in a memory device implemented with error correction in an embodiments of the present invention. Referring to FIG. 8, in response to a power on reset event at the memory device (452), the error correction event notification method 450, using the I2C serial data bus, writes to the ECCON register cell to activate the ECC function (454). The method 450 also writes to the CLRECC register cell to clear the ECC registers. For example, the Memory Bank address register cells, the row and column address cells are reset to their initial states ("0") or null value, the ECC Event register cell is set to the first state ("0"). The ERR pin, if used, is set to a reset state indicating no ECC event. In some embodiments, the method 450, using the I2C serial data bus, writes to the ERRON register cell and the ERR type register cells to configure the ERR pin for use as an external indicator of ECC events (455).

Then, the method 450 monitors for the occurrence of ECC events during memory operation (456). For example, the method 450 monitors for the occurrence of ECC events during memory read operations. In one embodiment, the ECC control circuit 404 detects an ECC event and generates an indicator signal thereof. The method 450 determines if an ECC event has occurred (458). When no ECC event is reported, the method 450 repeats at 456 to continue to monitor for ECC event occurrence during the memory operation.

When an ECC event has occurred, such as indicated by the ECC control circuit 404, the method 450 then set the ECC Event register cell to the second state ("1") indicating the occurrence of an ECC event (460). If the ERR pin has been configured by the ERRON register cell, the method 450 also set the ERR pin to an asserted state to indicate the occurrence of an ECC event. Next, the method 450 stores the memory bank address and the memory address location (row and column addresses) into the respective mode registers (462). For example, the memory bank address is stored in the respective bank address register cells, the lower five bits of the column address are stored in the column addr[4:0] register cells, the upper eight bits of the column address are stored in the column addr[12:5] register cells, and the 16-bit row address is stored in the row address register cells row addr[7:0] and row addr[15:8].

After recording an ECC event, the method 450 continues at 456 to monitor for ECC events during the memory operation. Subsequent ECC events will be recorded in the ECC register by overwriting of previous data. With the error correction event notification information thus stored in the ECC event registers, the method 450 enables the ECC registers to be accessed through the I2C serial data bus (464).

In some cases, the external system may want to reset the values of the error correction registers (466). For example, after the external system reads out the current ECC information, the external system may wish to reset the ECC registers so that the ECC registers can record the next ECC event. In that case, the external system may, through the I2C serial data bus, write to the CLRECC register cell to clear or reset the values of the ECC registers (454). When the CLRECC register cell is written to the second state ("1"), the ECC registers are cleared and the ERR pin, if used, is reset. That is, the ECC Event register cell, the memory bank address cells, the row and column address cells are all reset to their initial states ("0") or null value, and the ERR pin, if used, is initialized. The method 450 then continues with monitoring the ECC event 456 during memory operation.

Figures 9, 10:
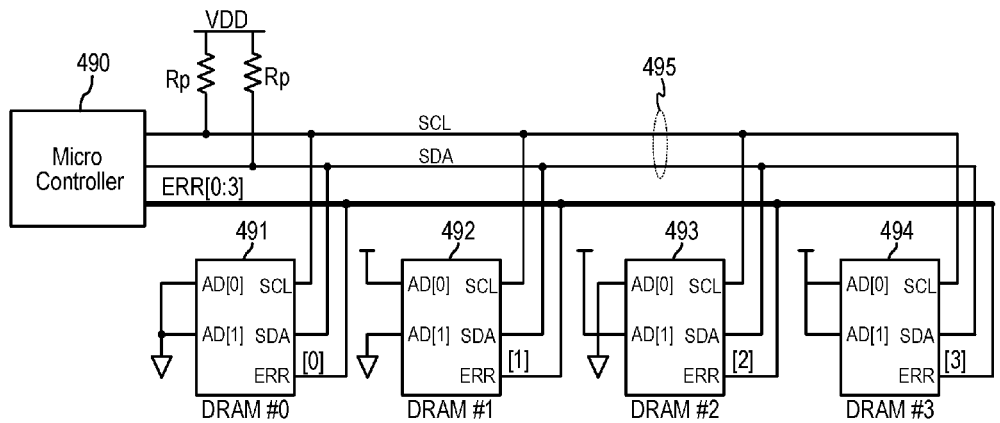
FIG. 9 is a schematic diagram of a system including multiple memory devices communicating with a controller using an I2C serial data bus in one example.
FIG. 10 illustrates two exemplary I2C address frames in some examples.

As described above, the error correction event notification method using an I2C serial data bus of the present invention can be applied in system configuration involving a single memory controller driving multiple memory devices. The error correction event notification method is capable of reading the ECC event information and of configuring the ECC operation for each memory device through the I2C serial data bus. FIG. 9 is a schematic diagram of a system including multiple memory devices communicating with a controller using an I2C serial data bus in one example. Referring to FIG. 9, a set of memory devices 491 to 494, each implementing the error correction event notification method of the present invention, enable a micro-controller 490 to act as a master to communicate over the I2C bus with the memory devices 491-494 to obtain ECC event information and to configure the ECC operation on each memory device. The micro-controller 490 communicates over an I2C bus 495 with the memory devices 491 to 494. In the present example, the memory devices are DRAMs.

The I2C protocol describes the use of open drain bus drivers. Therefore, the SCL signal line and the SDA signal are connected to the positive power supply VDD through respective pull up resistors Rp. The SCL signal line and the SDA signal line are shared by all the memory devices (slave devices).

As thus configured, the micro-controller 490 acts as a master and the memory devices 491-494 act as slaves in the I2C communication protocol. The device address terminal for each memory device is connected in a given manner to assign each memory device with a unique device address. For example, the memory device 491 has the device address terminal AD[1:0] programmed to <0,0>, the memory device 492 has the device address terminal AD[1:0] programmed to <0,1>, the memory device 493 has the device address terminal AD[1:0] programmed to <1,0>, and the memory device 494 has the device address terminal AD[1:0] programmed to <1,1>. Under the I2C communication protocol, the micro-controller 491 sends a message indicating the device address of the intended memory device in the slave address frame so that the respective memory device understands if it is the intended recipient of the message. With the use of the I2C serial data bus, a system involving multiple memory devices may implement the error correction event notification method using an I2C serial data bus of the present invention to configure and monitor ECC events at the multiple memory devices using a single micro-controller master.

In the present embodiment, the ERR pin of each memory device 491-494 are connected to a parallel data bus 496 and coupled to the micro-controller 490. As thus configured, the micro-controller 490 may monitor the ECC event notification status of each memory device.

Under the I2C communication protocol, the master and slave devices communicate using messages that are transmitted over the SDA data signal line at the clock rate defined by the SCL clock signal line. Under I2C, messages are broken up into two types of frame: an address frame, where the master indicates the slave to which the message is being sent, and one or more data frames, which are 8-bit data messages passed from master to slave or from slave to master. The address frame is always first in any new communication sequence. For a 7-bit address, the address is clocked out most significant bit (MSB) first, followed by a R/W bit indicating whether this is a read (1) or write (0) operation.

The 9th bit of the frame is the NACK/ACK bit. This is the case for all address and data frames. Once the first 8 bits of the frame are sent, the receiving device is given control over the SDA signal line. If the receiving device does not pull the SDA signal line low before the 9th clock pulse, it can be inferred that the receiving device either did not receive the data or did not know how to parse the message. In that case, the exchange halts, and it's up to the master of the system to decide how to proceed.

After the address frame has been sent, data can begin being transmitted. The master will simply continue generating clock pulses at a regular interval, and the data will be placed on SDA data signal line by either the master or the slave, depending on whether the R/W bit indicated a read or write operation. The number of data frames is arbitrary, and most slave devices will auto-increment the internal register, meaning that subsequent reads or writes will come from the next register in line.

FIG. 10 illustrates two exemplary I²C address frames in some examples. Referring to FIG. 10, after the start condition, the master generates the slave address frame to select a particular slave device, such as one of memory devices 491-494. The slave address frame uses the four most significant bits to indicate the device type or the slave ID, and the second and third least significant bits (bits 6 and 7) to indicate the device select address (AD[1] and AD[0]) and the least significant bit (bit 8) to indicate the read or write operation. The device type or slave ID indicates the type of devices, such as DRAM or SRAM. The device select address must match the device address AD[1:0] assigned for each memory device in order to select the respective device.

The master transmits the slave address frame designated a specific slave device. After the selected slave device acknowledges the slave address frame, the master can then transmit a register address frame on the SDA bus for a write or read operation. In the present example, the register address frame has three bits A[0] to A[2] to select one of the six ECC registers. The I²C control circuit 406 includes an address latch to latch the register address provided in the register address frame. Subsequently, each access to the selected slave device will cause the latched address to increment automatically. Thus, sequential read or write operation does not require the register address to be provided again. The current register address is the address value stored in the latch—which can be a newly latched register address or an incremented register address. Read operation always uses the current register address. After the last register address, the address latch will roll over to the first register address (e.g. 000b).

Event Notification in a Memory Device Using an I²C Serial Data Bus

According to another aspect of the present invention, a memory device incorporates a serial data bus coupled to a control circuit of the memory device to enable monitoring and notification of operational events of the memory device. In this manner, a system or a user using the memory device of the present invention may monitor the operational events during the normal operation of the memory device to obtain information on the occurrence or status of certain events and/or the circuit locations of the event occurrence which may be critical to the functionality or reliability of the memory device. In particular, the memory device may continue with normal device operation while event notification data is provided through the serial data bus. In some embodiments, the serial data bus is an I²C serial data bus. The serial data bus event notification method of the present invention can be implemented in a memory device to give insight into the health of the semiconductor device and enabling preventive repair or replacement of the memory device or system in which it is used when needed.

More specifically, the error correction event notification method described above can be applied to monitor other events or functions in a memory device other than error correction events. In embodiments of the present invention, a memory device implements an event notification method to monitor events and functions in a memory device where the status or states of the events and functions are stored in designated event registers. In some embodiment, an I²C serial data bus coupled to an I²C control circuit is used to configure the events and functions and to access the designated event registers to retrieve the state or state information.

In one example, the event notification method is applied to monitor the redundancy function of a memory device. A redundancy control circuit in the memory device may detect when memory cell redundancy needs to be applied and stores in the designated event registers the redundancy status, and the row address and column address to which redundant memory cells have been assigned. In this manner, an external system, such as a memory controller, may use the serial data bus, such as the I²C bus, to access the event registers to determine the redundancy status of the memory device in terms of the usage of the redundant memory cells and the memory location where redundant memory cells are applied.

In embodiments of the present invention, the control circuit and the ECC control circuit of the memory device are constructed as digital or analog circuitry on a semiconductor substrate.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory device implementing error correction function during operation of the memory device, comprising:
    a memory array comprising a first memory array configured to store memory data and a second memory array configured to store error correction check bits corresponding to the stored memory data;

a memory control circuit configured to control read and write operation of the memory device;

an error correction control circuit configured to control the error correction function of the memory device, the error correction control circuit being configured to generate error correction check bits for write data to be stored in the first memory array and to detect and correct read data retrieved from the first memory array using the corresponding error correction check bits from the second memory array;

a set of registers, in communication with the error correction control circuit, the set of registers including an error correction event register storing a value indicating an occurrence of an error correction event; and a serial bus control circuit coupled to a serial data bus and in communication with the set of registers, the serial bus control circuit be configured to provide access to the error correction event register and to provide control of the error correction function at the error correction control circuit through the serial data bus, wherein the error correction control circuit set the error correction event register to a first value in response to an error correction event being detected in the read out data, and the error correction event register is accessed using the serial data bus to provide the indication of the error correction event.

2. The memory device of claim 1, wherein the memory device receives a command and a memory address to read out stored memory data from a memory location associated with the memory address in the first memory array during the operation of the memory device, the memory location in the first memory array is accessed in response to the command and the memory address and the stored memory data from the accessed memory location in the first memory array is retrieved with the error correction check bits corresponding to the accessed memory location and stored in the second memory array, the error correction control circuit being configured to check the retrieved memory data for bit errors using the retrieved check bits, the error correction control circuit being configured to generate corrected memory data using the retrieved check bits and to set the error correction event register to the first value in response to a bit error being detected in the retrieved memory data, the corrected memory data being provided as the read out memory data.

3. The memory device of claim 1, wherein the serial data bus comprises an I$^2$C serial data bus including a clock signal line and a data signal line.

4. The memory device of claim 1, wherein the memory device implements error correction code (ECC) and the error correction check bits comprise error correction code (ECC) check bits corresponding to the stored memory data.

5. The memory device of claim 1, wherein the set of registers comprises a register designated as an error correction function on/off register storing a value indicating the error correction function to be turned on or off, and wherein the error correction control circuit is configured to control the error correction function of the memory device in response to the value of the error correction function on/off register, the error correction control circuit being configured to turn on and off the error correction function of the memory device in response to the value of the error correction function on/off register.

6. The memory device of claim 5, wherein the error correction function on/off register is accessed using the serial data bus to store a first value indicating the error correction function is to be turned on and a second value indicating the error correction function is to be turned off.

7. The memory device of claim 1, wherein the set of registers comprises a clear event register, the clear event register being assessed using the serial data bus to store a first value as an initial value and a second value to clear the values stored in the set of registers, and wherein in response to the clear event register being set to the second value, the error correction event register is set to the a second value indicating no error correction event has occurred.

8. The memory device of claim 1, wherein the memory device further comprises a pin being designated for error correction event notification, the pin being initialized to a first state, and wherein in response to the error correction event register being set to the first value, the pin is asserted to a second state, and wherein in response to the error correction event register being set to a second value indicating no error correction event has occurred, the pin is deasserted to the first state.

9. The memory device of claim 8, wherein the set of registers comprises a pin assignment register, the pin assignment register being assessed using the serial data bus to store a first value as an initial value and a second value to enable the pin of the memory device for error correction event notification.

10. The memory device of claim 1, wherein the set of registers comprises a plurality of address registers, the memory address associated with the corrected memory data being stored in one or more of the address registers by the error correction control circuit in response to the error correction event being detected, the address register being assessed using the serial data bus to read the stored memory address value.

11. The memory device of claim 10, wherein the first memory array is organized in two or more memory banks and the memory address comprises an identification of the memory bank in the memory array and an address in the memory bank, the identification of the memory bank and the address in the memory bank associated with the corrected memory data are stored in the one or more address registers in response to the error correction event signal being asserted.

12. The memory device of claim 1, wherein the set of registers comprises an error type register, a one-bit error counter register, and a multi-bit error counter register, the error correction control circuit storing a first value in the error type register indicating a one-bit error being detected and storing a second value in the error type register indicating a multi-bit error being detected, the one-bit error counter register storing a count value of all one-bit error detected, and the multi-bit error counter register storing a count value of all multi-bit error detected, and wherein the error type register, the one-bit error counter register, and the multi-bit error counter register all being assessed using the serial data bus to read the stored error type or count values.

13. The memory device of claim 1, wherein the set of registers comprises an error report type register being assessed using the serial data bus to store a first value indicating error notification to be provided only for one-bit error, a second value indicating error notification to be provided only for multi-bit error, and a third value indicating error notification to be provided only for one-bit error and multi-bit error.

14. The memory device of claim 1, wherein the series bus control circuit further comprises a is device address terminal being programmed to a device address value for identifying the memory device, wherein an address frame transmitted on the serial data bus includes the device address value associated with the memory device to select the memory device.

15. The memory device of claim 14, wherein a register address frame is transmitted on the serial data bus after the address frame to select a register in the set of registers for access.

* * * * *